United States Patent [19]

Mitome

[11] Patent Number: 5,172,189

[45] Date of Patent: Dec. 15, 1992

[54] EXPOSURE APPARATUS

[75] Inventor: Noriyuki Mitome, Kawasaki, Japan

[73] Assignee: Canon Kabushiki Kaisha, Tokyo, Japan

[21] Appl. No.: 680,354

[22] Filed: Apr. 4, 1991

[30] Foreign Application Priority Data

Apr. 6, 1990 [JP] Japan ................................. 2-91696

[51] Int. Cl.$^5$ ............................................. G01B 11/00
[52] U.S. Cl. ..................................... 356/401; 250/548; 355/53
[58] Field of Search ................. 356/399, 400, 401; 250/548; 355/53

[56] References Cited

U.S. PATENT DOCUMENTS

4,931,830  6/1990  Suwa et al. .......................... 355/53
4,939,630  7/1990  Kikuchi et al. ...................... 359/618
4,943,733  7/1990  Mori et al. .......................... 356/401

Primary Examiner—F. L. Evans
Attorney, Agent, or Firm—Fitzpatrick, Cella, Harper & Scinto

[57] ABSTRACT

An exposure apparatus includes a stage for carrying thereon a wafer; an exposure system for projecting radiation energy to the wafer to print a pattern thereon; and a detection optical system having a sigma value defined as the ratio of the diameter of an image of an aperture of a stop to the diameter of the aperture of the stop for projecting a radiation beam to the wafer and for receiving a reflection beam reflected from the wafer to detect a mark of the wafer which is defined by a level difference on the wafer, the detection optical system including an adjuster for changing the sigma value in accordance with the level difference defining the mark.

33 Claims, 3 Drawing Sheets

EXPOSURE APPARATUS

FIELD OF THE INVENTION AND RELATED ART

This invention relates to an exposure apparatus and, more particularly, to an exposure apparatus for manufacture of semiconductor devices such as ICs, LSIs, etc.

The manufacture of semiconductor devices includes a lithographic process for exposing a resist on a wafer to a circuit pattern with radiation to thereby transfer and print the circuit pattern on the wafer. In this exposure process, different fine patterns should be transferred onto the wafer sequentially so that they are superposed one upon another. This necessitates high-precision alignment or registration between a pattern having already been transferred to the wafer and a pattern which is going to be transferred to the wafer. Conventionally, alignment marks are provided on the wafer and these marks are observed through a TV camera or the like to detect the position of the wafer, that is, the position of the pattern. Then, on the basis of the detection, the position of the wafer pattern with respect to a pattern which is formed on a mask or the like and which is going to be transferred to the wafer, is adjusted.

In an exposure process wherein a pattern having a relatively small level-difference structure is going to be transferred to a wafer, the level difference which defines an alignment mark is also small. When such a mark is observed through a TV camera or the like, it is not easy to obtain a mark image of good contrast. This leads to decreased precision of the wafer position detection and, thus, results in failure of correct alignment of a transferred pattern and a pattern which is going to be transferred. Namely, this hinders manufacture of good quality semiconductor devices.

SUMMARY OF THE INVENTION

It is accordingly a primary object of the present invention to provide an improved exposure apparatus which is effective in exposure of a wafer even if it has a mark of relatively small level-difference structure.

In accordance with a first aspect of the present invention, to achieve this object, there is provided an exposure apparatus, comprising: a stage for carrying thereon a wafer; an exposure system for projecting radiation energy to the wafer to print a pattern thereon; and a detection optical system having a sigma value, for projecting a radiation beam to the wafer and for receiving a reflection beam reflected from the wafer to detect a mark of the wafer which is defined by a level difference on the wafer, said detection optical system including an adjuster for changing the sigma value in accordance with the level difference defining the mark.

In accordance with a second aspect of the invention, there is provided an exposure apparatus, comprising: a stage for carrying thereon a wafer; an exposure system for projecting radiation energy to the wafer to print a pattern thereon; and a detection optical system having a sigma value, for projecting a radiation beam to the wafer and for receiving a reflection beam reflected from the wafer to detect an image of a mark provided on the wafer, said detection optical system including an adjuster for changing the sigma value to provide a higher contrast of the image of the mark.

In accordance with a third aspect of the invention, there is provided an exposure apparatus usable with a mask and a wafer, comprising: a stage for carrying thereon the wafer; a projection optical system for projecting an image of a circuit pattern of the mask onto the wafer; and a detection optical system having a sigma value, for projecting a radiation beam to the wafer and for receiving a reflection beam reflected from the wafer to detect an alignment mark of the wafer which is defined by a level difference on the wafer, said detection optical system including an adjuster for changing the sigma value in accordance with the level difference defining the alignment mark.

In accordance with a fourth aspect of the present invention, there is provided an exposure apparatus usable with a mask and a wafer, comprising: a stage for carrying thereon the wafer; a projection optical system for projecting an image of a circuit pattern of the mask onto the wafer; and a detection optical system disposed beside said projection optical system and having a sigma value, for projecting a radiation beam to the wafer and for receiving a reflection beam reflected from the wafer to detect an alignment mark of the wafer which is defined by a level difference on the wafer, said detection optical system including an adjuster for changing the sigma value in accordance with the level difference defining the alignment mark.

Further, in accordance with a fifth aspect of the present invention, there is provided a method of manufacturing of semiconductor devices, wherein an alignment mark of a wafer defined by a level difference is detected by projecting a radiation beam to the wafer and by receiving a reflection beam reflected from the wafer, wherein a position of the wafer is then adjusted on the basis of the detection of the alignment mark of the wafer, and wherein the wafer is then exposed with radiation energy to thereby print a circuit pattern on the wafer, characterized by: changing at least one of a numerical aperture for the radiation beam projection and a numerical aperture for the reflection beam reception, in accordance with the level difference defining the alignment mark of the wafer, such that the alignment mark of the wafer is detected with the changed numerical aperture.

In accordance with a sixth aspect of the invention, there is provided a method of manufacturing semiconductor devices, wherein an image of an alignment mark of a wafer defined by a level difference is detected by projecting a radiation beam to the wafer and by receiving a reflection beam reflected from the wafer, wherein a position of the wafer is then adjusted on the basis of the detection of the image of the alignment mark of the wafer, and wherein the wafer is then exposed with radiation energy to thereby print a circuit pattern on the wafer, characterized by: changing at least one of a numerical aperture for the radiation beam projection and a numerical aperture for the reflection beam reception, so as to provide higher contrast of the image of the alignment mark of the wafer, such that the alignment mark of the wafer is detected with the changed numerical aperture.

In accordance with a seventh aspect of the present invention, there is provided a method of manufacturing of semiconductor devices, wherein an image of an alignment mark of a wafer defined by a level difference is detected by projecting a radiation beam to the wafer and by receiving a reflection beam reflected from the wafer, wherein a position of the wafer with respect to a circuit pattern of a mask is then adjusted on the basis of the detection of the image of the alignment mark of the wafer, and wherein the wafer is then exposed to the circuit pattern of the mask with radiation energy to thereby print the circuit pattern on the wafer, characterized by: changing at least one of a numerical aperture for the radiation beam projection and a numerical aperture for the reflection beam reception, in accordance with the level difference defining the alignment mark of the wafer, such that the alignment mark of the wafer is detected with the changed numerical aperture.

In one preferred form of the present invention, when a first wafer with a first mark having a particular level difference and a second wafer with a second mark having a level difference smaller than that of the first mark of the first wafer are to be processed, the sigma value ($\sigma$) of a mark detecting optical system for light projection and light reception is set smaller than the detection of the second mark of the second wafer, as compared with the detection of the first mark of the first wafer, so as to ensure a good signal-to-noise ratio both for the detection of the first mark and for the detection of the second mark. When the level difference (h) of a mark of a wafer satisfies a relation $0 < h \leq 0.05$ (micron), the sigma value ($\sigma$) of the detection optical system for light projection and light reception may be set to a small value satisfying $0 < \sigma \leq 0.4$, for example.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
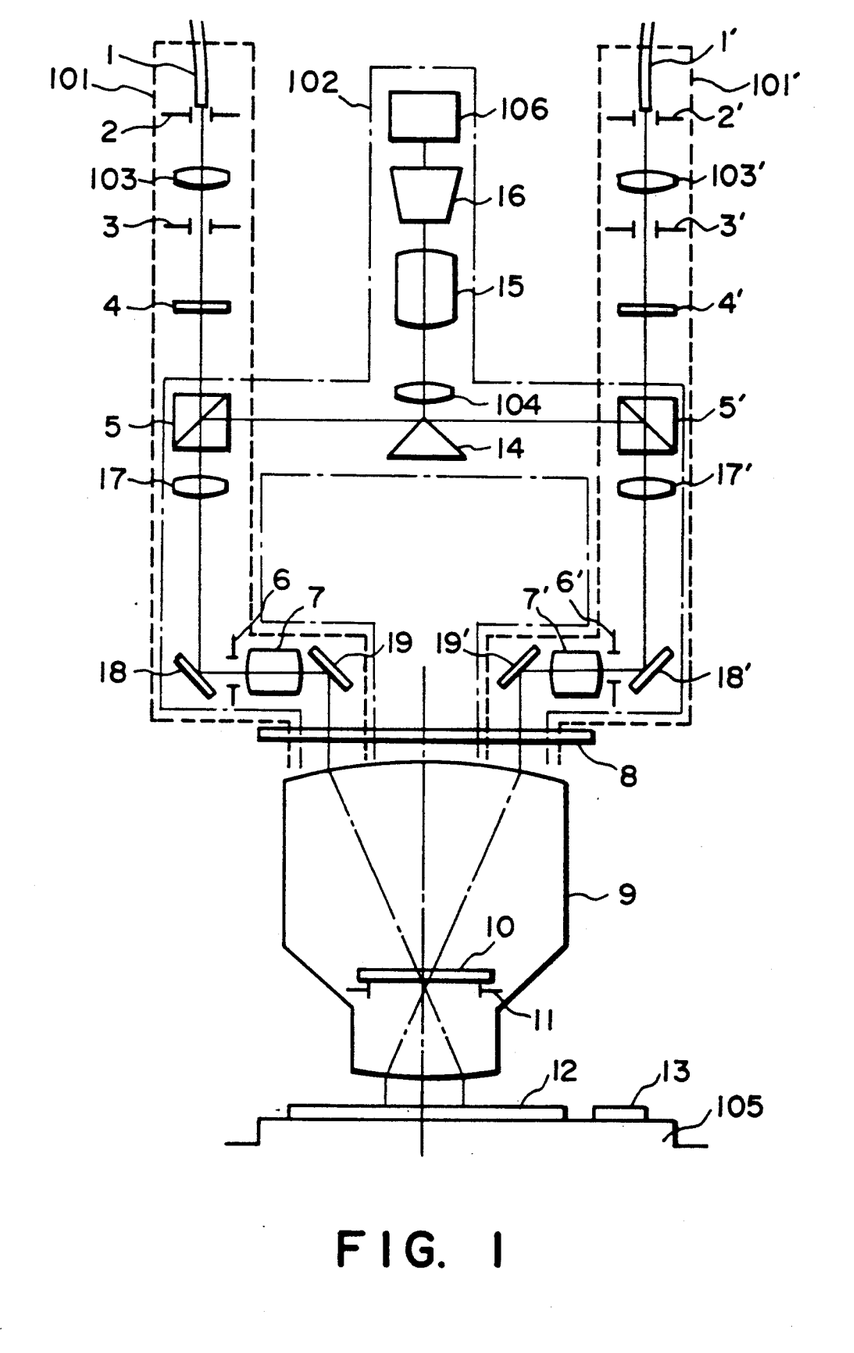
FIG. 1 is a schematic view of an exposure apparatus according to a first embodiment of the present invention.

FIG. 1 is a schematic view of a first embodiment of the present invention.

In this embodiment, the invention is applied to a step-and-repeat type reduction projection exposure apparatus.

Denoted in FIG. 1 at 101 and 101' are portions of an illumination system, and denoted at 102 is a portion of an observation system. Since the illumination system and the observation system each has a symmetrical structure, explanation will be made only to one of the left and right portions of the symmetrical structure.

Denoted at 1 is an optical fiber having a light emission end from which light is emitted for an alignment purpose. This alignment light has a wavelength substantially the same as the wavelength of the light to be used for reduction projection exposure, for projecting a circuit pattern formed on a reticle 8 surface onto a resist provided on a wafer 12 surface in a reduced scale. In this embodiment, an ultra-high pressure Hg lamp is used for the exposure purpose, and a portion of the light emitted by this Hg lamp is guided for the alignment purpose. Denoted at 2 is an iris stop of a variable aperture diameter. By changing the aperture diameter of the stop 2 to control the size of the pupil of the illumination system 101, it is possible to change the numerical aperture (NA) at the light emission side of the illumination system 101 to thereby change the coherence factor $\sigma$ ("NA of illumination system"/"NA of observation system") of a detection optical system provided by the illumination system 101 and the observation system 102. Denoted at 103 is a condensing lens, and denoted at 3 is a field stop which is provided at a position optically conjugate with the wafer 12 surface and the reticle 8 surface. The size of the aperture of the stop 3 is determined so as to assure that the alignment light illuminates an alignment mark on the wafer 12 surface and a portion around the mark that it does not illuminate is a pattern region, other than those portions.

Denoted at 4 is a light adjusting member for modulating the intensity of the alignment light, and it comprises, for example, a polarizing plate rotatable about the optical axis of the illumination system 101 or a variable ND (neutral density) filter of turret type having portions of different light transmittances. Denoted at 5 is a polarization beam splitter for transforming the alignment light into P-polarized light and for directing the same to the wafer 12. Also, the polarization beam splitter 5 cooperates with a quarter waveplate 10 to direct reflected light from the wafer 2 efficiently to a light receiving surface of an image pickup device 16 of the observation system 102. Denoted at 17 is a relay lens, and denoted at 6 is an iris stop of variable aperture diameter which is set at a pupil plane of an objective lens 7. Also, the stop 6 is provided at a position which is optically conjugate with the iris stop 2, such that an image of the aperture of the stop 2 is formed within the aperture of the stop 6. The coherence factor mentioned hereinbefore corresponds to the ratio of the diameter of the image of the aperture of the stop 2 to the diameter of the aperture of the stop 2.

Denoted at 8 is a reticle, and denoted at 9 is a reduction projection lens system for projecting a circuit pattern of the reticle 8 onto a wafer 12, for manufacture of semiconductor devices, in a reduced scale of 1:5. In this example, the NA (numerical aperture) of the objective lens 7 on the reticle 8 side is of the same magnitude as the NA (numerical aperture) of the projection lens system 9 on the reticle 8 side. Also, the NA (numerical aperture) of the projection lens system 7 on the wafer 12 side is of a magnitude five times larger than the NA (numerical aperture) of the projection lens system 7 on the reticle 8 side.

Denoted at 10 is a quarter waveplate, and denoted at 11 is an iris stop which is set at the pupil position of the projection lens system 9. The stop 11 is provided at a position which is optically conjugate with the iris stop 2 or 6. Denoted at 105 is an X-Y stage which is movable both in a direction of the optical axis of the projection lens system 9 and in a direction along a plane orthogonal to the optical axis. Denoted at 13 is a reference mark provided on the stage 105. Denoted at 14 is a roof prism for combining the left-side viewfield and the right-side viewfield of the observation system, for observation of the images of left-side and right-side alignment marks of the reticle 8 and the wafer 12, at a common portion (104, 15, 16) of the observation system 102. Denoted at 15 is an erector which cooperates with a relay lens 104 to expand and re-focus the images of the left-side and right-side alignment marks of the reticle 8 and the wafer 12, formed in the neighborhood of the roof prism 14, upon the light receiving surface of the image pickup device (CCD) 16.

In the illumination system 101 of this embodiment, the light emanating from the fiber 1 illuminates the iris stop 2, and the light passing through the aperture of the stop 2 is collected by the condensing lens 103 to illuminate the field stop 3, by which the light beam diameter is restricted. The light passing through the aperture of the stop 3 is directed to the adjusting member 4, the polarization beam splitter 5, the relay lens 17, the mirror 18, the iris stop 6, the objective lens 7 and to the mirror 19 in this order, whereby the light is incident on a portion around the alignment mark of the reticle 8. Then, the light passing through the reticle 8 is directed through the projection lens system 9 to illuminate a portion around the alignment mark on the wafer 12 surface. It is to be noted here that this light is transformed from the P-polarized light to circularly polarized light under the influence of the quarter waveplate 10.

Reflected light from the alignment mark on the wafer 2 surface and a portion around it is collected by the projection lens system 9 to form an image of the wafer alignment mark at a position close to the reticle 8 surface. On the other hand, the reflected light illuminates the alignment mark of the reticle 8. At this time, under the influence of the quarter waveplate 10, the reflected light is transformed into S-polarized light. Then, the reflected light is directed to the mirror 19, the objective lens 7, the iris stop 6, the mirror 18 and to the relay lens 17 in this order, and it is reflected by the polarization beam splitter 5 to form images of the alignment marks of the reticle 8 and the wafer 12 at a position adjacent to the roof prism 14. After being reflected by the roof prism 104, the reflected light is directed by the relay lens 104 and the erector 15 toward the surface of the image pickup device 16, whereby the alignment marks of the reticle 8 and the wafer 12 are imaged on the light receiving surface of the image pickup device 16. The images of the alignment marks thus formed on the image pickup device 16 surface are observed through a display 106.

Video signals corresponding to the alignment mark images from the image pickup device 16 are inputted into a control device (not shown) through a signal line. The unshown control device serves to process the received video signals to determine the quantity of positional deviation between the reticle 8 and the wafer 12 and to produce a correction signal corresponding to the positional deviation. The reticle 8 is placed on a reticle stage (not shown), while the wafer 10 is placed on the X-Y stage 105. Each of these stages can be moved through a corresponding stage driving device. Here, the control device is electrically communicated with these stage driving devices, respectively, through respective signal lines, such that in response to a signal from the control device, at least one stage driving device operates to displace the corresponding stage through a determined quantity and in a determined direction. In this embodiment, the correction signal from the control device is applied to the stage driving device for driving the X-Y stage 105, and this driving device operates to move the X-Y stage 105 so as to correct the positional deviation of the wafer 10 with respect to the reticle 8 to thereby complete the positioning of the wafer 10.

In this embodiment, as described., the alignment marks of the reticle 8 and the wafer 12 are detected by a TTL (through the lens) on-axis method using the alignment light of the same wavelength as the exposure light, and, by processing light-field images of the alignment marks, the reticle-to-wafer alignment is executed.

Figure 2:
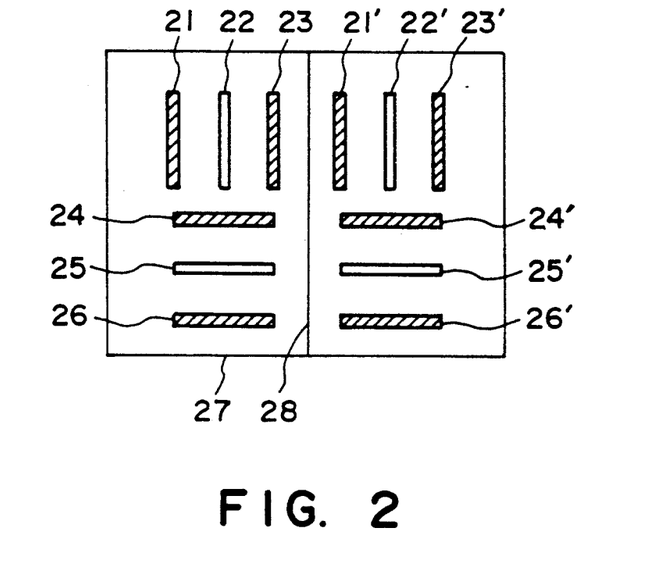
FIG. 2 is a schematic illustration, showing images of alignment marks.

FIG. 2 illustrates the images of the alignment marks of the reticle 8 and the wafer 12, as formed on the light receiving surface of the image pickup device 16. In FIG. 2, the mark images depicted by hatching and denoted at 21, 23, 24 and 26 as well as 21', 23', 24' and 26' are images (reticle signals) of the left-side and right-side alignment marks of the reticle 8. On the other hand, the mark images denoted at 22 and 25 as well as 22' and 25' are the images (wafer signals) of the left-side and right-side alignment marks of the wafer 12. The presence/absence of a suffix corresponds to the left-side and right-side illumination systems of FIG. 1. Denoted at 27 is the image-pickup range of the image pickup device 16, and denoted at 28 is the ridge line of the roof prism 14.

Figure 3:
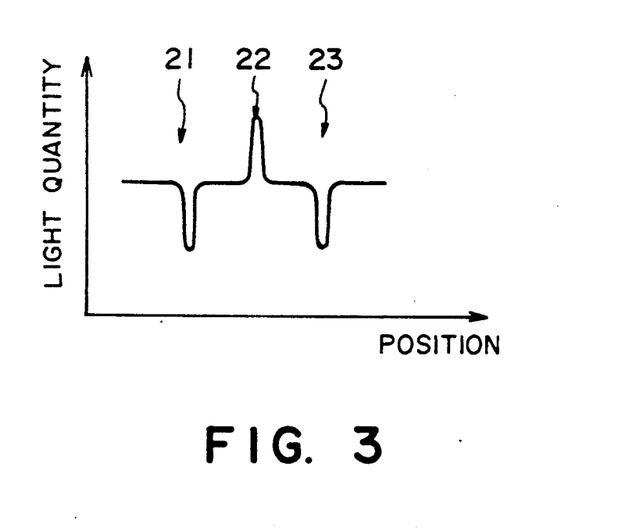
FIG. 3 is a graph showing an electric signal obtained by photoelectric conversion of mark images.

FIG. 3 shows an output video signal obtainable as a result of an electric scan of the alignment mark images 21, 22 and 23 in FIG. 2, through the image pickup device 16 in a positional deviation detecting direction (horizontal direction as viewed in the drawing). The reticle alignment mark images 21 and 23 are dark because they are the images (shadows) as formed by irradiating the reticle 8 with the reflection light from the wafer 12 under the influence of the quarter waveplate of the projection lens system 9, as described. On the other hand, the wafer alignment mark image 22 is different depending upon the process of wafer 12. Here, the illustrated is a case wherein the image is brighter as compared with the surrounding portion.

In this embodiment, if the pattern of the wafer has a small level difference (surface height difference) and if the contrast of the mark image 22 is low and, as a result, a sufficient alignment precision is difficult to achieve, the aperture diameter of at least one of the iris stops, namely, the iris stop 2 of the illumination system 101 and the iris stop 6 of the objective lens 7 which is a common component of the illumination system 101 and the observation system 102, is changed to adjust the coherence factor $\sigma$ of the detection optical system. More specifically, the aperture diameter of at least one of the stops 2 and 6 is adjusted so as to reduce the coherence factor $\sigma$, as compared with that to be set for the alignment mark detection on an occasion when the pattern of the wafer has a relatively large level difference, to thereby assure highest contrast of the alignment mark image (or highest evaluation quantity with respect to the mark image, related to the alignment precision).

This is based on the finding, by the inventor of the subject application, that, for observation of an alignment mark on a wafer of a certain process, there are an optimum numerical aperture (NA) of an objective lens and an optimum coherence factor $\sigma$ of an illumination optical system.

Based on this finding, the iris stop 6 whose aperture size is variable is disposed at the pupil of the objective lens 7, which is one component of the observation system 102 to make it possible to change the numerical aperture (NA) of the objective lens. Alternatively, with the iris stop 2 of variable aperture size disposed at the pupil plane of the condensing lens 103 of the illumination system 101 the coherence factor $\sigma$ of the illumination system is made adjustable. In this particular embodiment, the aperture diameter of the stop 2 can be changed manually by an operator on the basis of observation of the mark image as displayed on the display 16, to adjust the coherence factor $\sigma$.

The aperture diameter may be determined by using pilot wafers for offset discrimination in wafer processes, so that in each process an optimum evaluation quantity is provided. Such an evaluation quantity may be contrast of an image, the quantity of shift of the image as the wafer is defocused or any other quantity, all being related to the alignment precision.

Usually, a smaller coherence factor $\sigma$ may be set only to such a wafer with a mark having a small level difference of on an order not greater than 0.05 micron, and an initial or larger coherence factor may be retained to wafers having a relatively large level difference. However, if necessary, the aperture diameter of the stop 2 may be changed in each process to change the coherence factor $\sigma$, and the images of the alignment marks of the reticle 8 and the wafer 12 may be taken to detect the positional relationship of them, and the alignment and exposure of them may be made in accordance with the results of the detection.

In this embodiment, for each process the aperture diameter is determined. However, this determination may be made for each lot or for each wafer. If it is to be done for each wafer, a pilot wafer is not used and an actual wafer to be used for manufacture of semiconductor devices is used.

However, if such an aperture diameter change is made, the condition for positional deviation detection of the reticle 8 and the wafer 12 changes from a standard condition set for a wafer having an alignment mark of a relatively large pattern level difference (for example, the numerical aperture of the objective lens is the same as the numerical aperture of the projection lens system on the reticle side, and the coherence factor $\sigma$ of the illumination system is equal to 0.7). This results in a possibility that the offset quantity for the positional deviation detection as determined under the standard condition is changed. In consideration thereof, if the aperture diameter is changed, in order to compensate for such a change in the offset quantity, after the aperture diameter change, the alignment and exposure of a pilot wafer is effected and any misregistration between superposed circuit patterns (one is a pattern already formed on a wafer and the other is a pattern transferred thereto by the exposure) is detected, and the offset quantity is set again on the basis of the result of the detection. To a wafer having a relatively small level difference to which the positional deviation detection and exposure is to be made with a changed aperture diameter, such a re-set offset quantity is used for the positional deviation detection.

TABLE 1

| $\sigma$ | Contrast |
|---|---|
| 0.3 | 0.13 |
| 0.6 | 0.11 |
| 0.7 | 0.07 |

Table 1 shows measured values of contrast of an alignment mark image, changing with the coherence factor $\sigma$, on an occasion when an actual process wafer having an alignment mark with a nitride film, of a small level difference on an order of about 0.02 micron, is used with the exposure apparatus of the present embodiment. From this table, it is seen that, by reducing the coherence factor $\sigma$ from 0.7 to 0.3, the contrast is increased.

Here, the numerical aperture (NA) of the objective lens 7 is 0.43, as converted on the wafer side of the projection lens system 9, and is constant. While the light quantity to be received by the image pickup device 16 is changeable with a change in size of the iris stop 2, the light adjusting member 4 is rotated on the basis of the level of the signal outputted from the image pickup device 16 to control the light so that a substantially constant quantity of illumination light irradiates the alignment mark of the wafer 12. As an alternative method, the change in quantity of illumination light resulting from the change in area of the aperture of the iris stop 2 may be detected beforehand, and the adjusting member 4 may be rotated in association with the iris stop 2 so as to maintain the quantity of illumination light constant. When the aperture diameters of the two iris stops 2 and 6 are to be changed, the optimization of the aperture diameter of each of the two iris stops 2 and 6 may be made by using a pilot wafer or the like having been processed by the same process as a wafer which is going to be processed, and, in such a process, the numerical aperture (NA) of the objective lens 7 and the coherence factor $\sigma$ may be determined.

As described hereinbefore, to a wafer with an alignment mark having a small level difference, the coherence factor $\sigma$ is changed to provide a smaller coherence factor $\sigma$ as compared with that for a wafer with an alignment mark having a large level difference, to thereby assure increased contrast of an alignment mark image.

As a result of investigations made by the inventor of the subject application, it has been found that, for a wafer with an alignment mark having a level difference or height h in a range of $0 < h \leq 0.05$ (micron), a coherence factor $\sigma$ in a range of $0 < \sigma \leq 0.4$ can provide good contrast of an alignment mark image.

Figure 4:
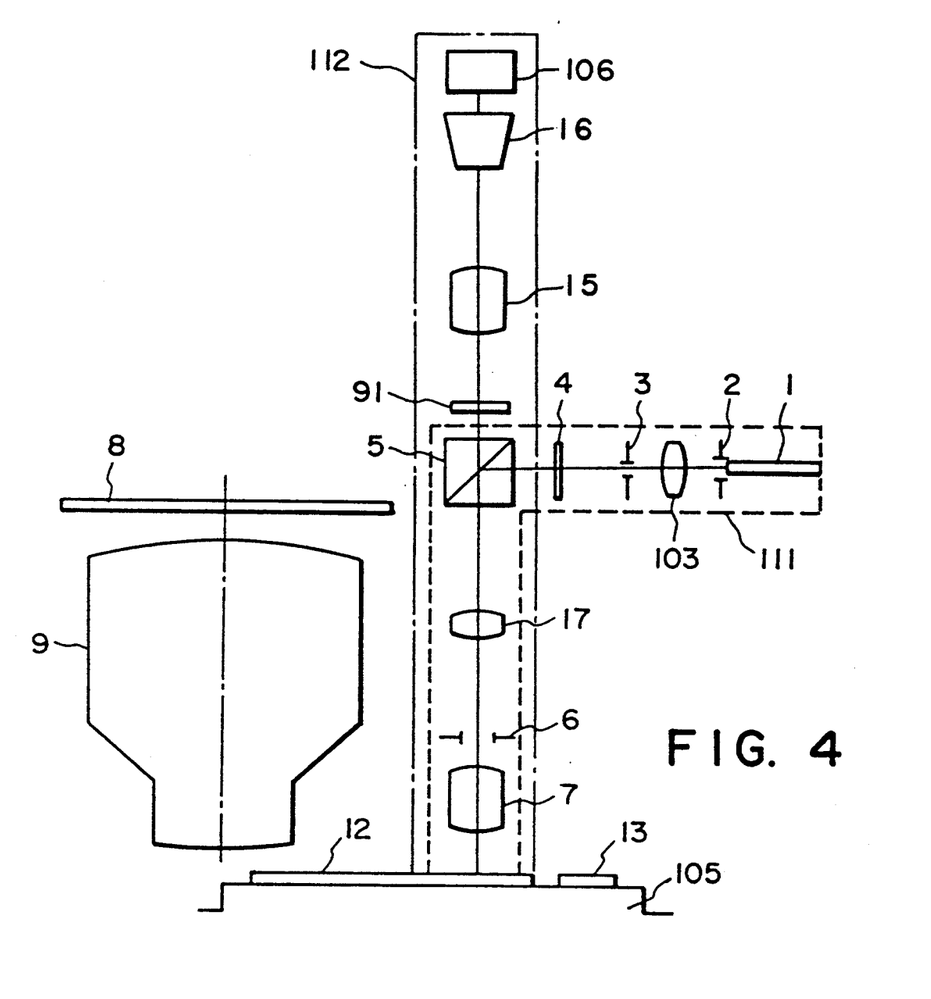
FIG. 4 is a schematic view of an exposure apparatus according to a second embodiment of the present invention.

FIG. 4 is a schematic view of a second embodiment of the present invention. Also in this embodiment, the invention is applied to a reduction projection exposure apparatus.

In this embodiment, the detection optical system for detecting an alignment mark of a wafer comprises an off-axis optical system which executes the observation without intervention of a projection lens system, and it includes an illumination system 111 for illuminating the wafer and an observation system 112 having a reference mark provided therein to execute the alignment operation. In this embodiment, like numerals as those of FIG. 1 are assigned to corresponding elements.

In this embodiment, light emanating from the fiber 1 has a wavelength different from that of exposure light, to be used for the exposure. The light from the fiber 1 goes through an iris stop 2 and is collected by a condensing lens 103 to illuminate a field stop 3. The light passing through the aperture of the stop 3 is modulated by a light adjusting member 4 and, thereafter, it is reflected by a beam splitter 5. Subsequently, the light is directed to a relay lens 17, an iris stop 6 and to an objective lens 7, whereby it illuminates an alignment mark on the surface of a wafer 12. The described structure is the structure of the illumination system. Reflection light reflected by the alignment mark of the wafer 12 surface and a portion around it is collected by the objective lens 7, and the light is directed to the iris stop 6, the relay lens 17 and to the beam splitter 5, whereby the light is focused on a reference mark plate 91 surface.

Figure 5:
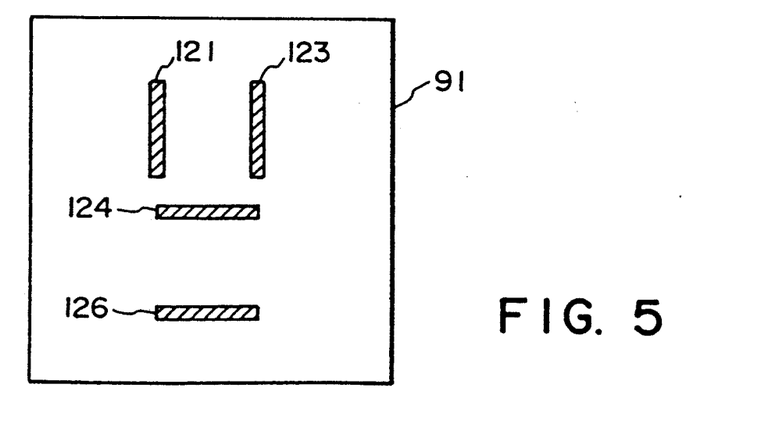
FIG. 5 is a schematic illustration, showing reference marks used in the FIG. 4 embodiment.

The reference mark plate 91 is formed with a reference mark having a predetermined positional relationship with a reticle 8, once the latter is positioned with respect to a stationary portion of the exposure apparatus. As for the method of discriminating the positional relationship between the reticle 8 and the reference mark, although an optical system for observing the reticle 8 is not illustrated, such a reticle observing optical system and the detection optical system (111, 112) and the reference mark 13 may be used to detect the positional relationship between the reticle 8 and the reference mark on the plate 91, and comparison and correction with respect to an offset value based on actual printing and misregistration detection using a pilot wafer may be made. As shown in FIG. 5, the reference mark plate 91 is formed with marks 121, 123, 124 and 126, and, in the neighborhood of the reference mark of the reference mark plate 91, the image of the alignment mark of the wafer 12 is formed in a similar manner as shown in FIG. 2, and both of these alignment marks are imaged by an erector 15 upon the light receiving surface of the image pickup device 16. While monitoring the video signal from the device 16, the wafer 12 is displaced so as to align the alignment mark thereof with respect to the reference mark of the plate 91. In this manner, the wafer 12 is indirectly aligned with the reticle 8. After such an alignment operation is completed, the wafer stage 105 is moved in an appropriate direction by a predetermined amount to thereby position the wafer 12 at the exposure station.

The operation for increasing the contrast of the wafer alignment mark image in this embodiment is essentially the same as that made in the preceding embodiment, and substantially the same advantageous effects as the preceding embodiment are obtainable.

The present embodiment may be modified so that, by using the detection optical system (111, 112), the alignment mark of the wafer 12 is observed through the projection lens system 9 and with the use of a non-exposure light.

While in the preceding embodiments, the coherence factor $\sigma$ of the detection optical system is adjusted by changing the diameter of the aperture of the iris stop 2, the coherence factor $\sigma$ may be changed by changing the diameter of the iris stop 6 or by changing the aperture diameters of both the iris stops 2 and 6.

Further, in place of changing the aperture diameter of an iris stop, the condensing lens 103 may be provided by a variable-magnification optical system which serves to change the imaging magnification (light source image) of the iris stop 2 to the aperture of the stop 6 which is at the pupil plane of the objective lens 7. By this, it is possible to change the coherence factor $\sigma$. On that occasion, the change in the quantity of illumination light is small.

In the present embodiment, for illumination of a wafer, light having a wavelength different from that of the exposure light may be used. Thus, in the embodiment of FIG. 1, such light may be used. For example, monochromatic light or multi-color light from a light source such as an He-Ne laser, a halogen lamp, a xenon lamp, an LED or the like may be used, provided that the wafer-to-reticle alignment is possible with that light. Further, in place of light-field observation, dark-field observation may be used for the observation of the wafer alignment mark.

Further, in the foregoing embodiments, the invention is applied to a projection exposure apparatus having a reduction projection lens system. However, the invention is not limited to this type of an exposure apparatus, and it is applicable to an apparatus having a unit-magnification projection lens system or projection mirror system, a proximity exposure apparatus, a pattern drawing apparatus using laser light or an electron beam, and the like.

In the foregoing embodiments, the aperture diameter of the stop 2 is changed manually by an operator to adjust the coherence factor $\sigma$. However, it may be made automatically. For example, a video signal corresponding to the mark image as outputted from the image pickup device 16 may be inputted to a controller (not shown) of the exposure apparatus and, on the basis of evaluation of the video signal through the controller, the aperture diameter of the stop may be adjusted in accordance with the contrast of the mark image. Alternatively, the aperture diameter of the stop may be adjusted automatically on the basis of inputted information regarding the level difference (height) of the alignment mark.

In accordance with the present invention, as described hereinbefore, the coherence factor o for illumination and detection of a mark such as an alignment mark of a wafer, being defined by a level difference, can be changed in accordance with the magnitude (height) of the level difference defining the mark and, by doing so, a mark image of good contrast can be formed irrespective of the magnitude of the level difference of the mark. As a result, even on an occasion when an alignment mark of such a wafer having been subjected to a pattern forming process for forming a pattern of a small level-difference structure is used an alignment mark image of high contrast can be observed and, as a result, high-precision alignment is assured. Thus, it is possible to accomplish an exposure apparatus suitable for manufacture of semiconductor devices of high resolution.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    a stage for carrying thereon a wafer;
    an exposure system for projecting a radiation energy to the wafer to print a pattern thereon; and
    a detection optical system having a sigma value, for projecting a radiation beam to the wafer and for receiving a reflection beam reflected from the wafer to detect a mark of the wafer which is defined by a level difference on the wafer, said detection optical system comprising an adjuster for changing the sigma value in accordance with the level difference defining the mark.

2. An apparatus according to claim 1, wherein said detection optical system forms, on a predetermined image plane, an image of the mark by using the reflection beam, and wherein said adjuster is operable to change the sigma value so as to provide higher contrast of the image of the mark.

3. An apparatus according to claim 1, wherein the radiation beam has a wavelength different from that of the radiation energy.

4. An apparatus according to claim 1, wherein the radiation beam has the same wavelength as that of the radiation energy.

5. An apparatus according to claim 1, wherein said adjuster is operable to change the numerical aperture of said detection optical system for the radiation beam projection, to thereby change the sigma value.

6. An apparatus according to claim 1, wherein said adjuster is operable to change the numerical aperture of said detection optical system for the reflection beam reception, to thereby change the sigma value of said detection optical system.

7. An apparatus according to claim 1, wherein, when the level difference (h) is in a range of $0 < h \leq 0.05$ (micron), the sigma value ($\sigma$) is set in a range of $0 < \sigma \leq 0.4$.

8. An exposure apparatus, comprising:
a stage for carrying thereon a wafer;
an exposure system for projecting radiation energy to the wafer to print a pattern thereon; and
a detection optical system having a sigma value, for projecting a radiation beam to the wafer and for receiving a reflection beam reflected from the wafer to detect an image of a mark provided on the wafer, said detection optical system comprising an adjuster for changing the sigma value to provide a higher contrast of the image of the mark.

9. An apparatus according to claim 8, wherein the radiation beam has a wavelength different from that of the radiation energy.

10. An apparatus according to claim 8, wherein the radiation beam has the same wavelength as that of the radiation energy.

11. An apparatus according to claim 8, wherein said adjuster is operable to change the numerical aperture of said detection optical system for the radiation beam projection, to thereby change the sigma value.

12. An apparatus according to claim 8, wherein said adjuster is operable to change the numerical aperture of said detection optical system for the reflection beam reception, to thereby change the sigma value of said detection optical system.

13. An apparatus according to claim 8, wherein, when a level difference (h) on the wafer, defining a mark on the wafer, is in a range of $0 < h \leq 0.05$ (micron), the sigma value ($\sigma$) is set in a range of $0 < \sigma \leq 0.4$.

14. An exposure apparatus usable with a mask and a wafer, comprising:
a stage for carrying thereon the wafer;
a projection optical system for projecting an image of a circuit pattern of the mask onto the wafer; and
a detection optical system having a sigma value, for projecting a radiation beam to the wafer and for receiving a reflection beam reflected from the wafer to detect an alignment mark of the wafer which is defined by a level difference on the wafer, said detection optical system comprising an adjuster for changing the sigma value in accordance with the level difference defining the alignment mark.

15. An apparatus according to claim 14, wherein said detection optical system forms, on a predetermined image plane, an image of the mark by using the reflection beam, and wherein said adjuster is operable to change the sigma value so as to provide higher contrast of the image of the mark.

16. An apparatus according to claim 14, wherein the radiation beam has a wavelength different from that of a beam used for the projection of the image of the circuit pattern.

17. An apparatus according to claim 14, wherein the radiation beam has substantially the same wavelength as a beam used for the projection of the image of the circuit pattern.

18. An apparatus according to claim 14, wherein said detection optical system receives the reflection beam passed through the mask to detect a mark of the mask as well as the alignment mark of the wafer.

19. An apparatus according to claim 14, wherein said adjuster is operable to change the numerical aperture of said detection optical system for the radiation beam projection, to thereby change the sigma value.

20. An apparatus according to claim 14, wherein said adjuster is operable to change the numerical aperture of said detection optical system for the reflection beam reception, to thereby change the sigma value of said detection optical system.

21. An apparatus according to claim 14, wherein, when the level difference (h) is in a range of $0 < h \leq 0.05$ (micron), the sigma value ($\sigma$) is set in a range of $0 < \sigma \leq 0.4$.

22. An exposure apparatus usable with a mask and a wafer, comprising:
a stage for carrying thereon the wafer;
a projection optical system for projecting an image of a circuit pattern of the mask onto the wafer; and
a detection optical system disposed beside said projection optical system and having a sigma value, for projecting a radiation beam to the wafer and for receiving a reflection beam reflected from the wafer to detect an alignment mark of the wafer which is defined by a level difference on the wafer, said detection optical system comprising an adjuster for changing the sigma value in accordance with the level difference defining the alignment mark.

23. An apparatus according to claim 22, wherein said detection optical system forms, on a predetermined image plane, an image of the mark by using the reflection beam, and wherein said adjuster is operable to change the sigma value so as to provide higher contrast of the image of the mark.

24. An apparatus according to claim 22, wherein the radiation beam has a wavelength different from that of a beam used for the projection of the image of the circuit pattern.

25. An apparatus according to claim 22, wherein said adjuster is operable to change the numerical aperture of said detection optical system for the radiation beam projection, to thereby change the sigma value.

26. An apparatus according to claim 22, wherein said adjuster is operable to change the numerical aperture of said detection optical system for the reflection beam reception, to thereby change the sigma value of said detection optical system.

27. An apparatus according to claim 22, wherein, when the level difference (h) is in a range of $0 < h \leq 0.05$ (micron), the sigma value ($\sigma$) is set in a range of $0 < \sigma \leq 0.4$.

28. A method of manufacturing semiconductor device, wherein an alignment mark of a wafer defined by a level difference is detected by projecting a radiation beam to the wafer and by receiving a reflection beam reflected from the wafer, wherein a position of the wafer is then adjusted on the basis of the detection of the alignment mark of the wafer, and wherein the wafer is then exposed with radiation energy to thereby print a circuit pattern on the wafer, said method comprising the steps of:

changing at least one of a numerical aperture for the radiation beam projection and a numerical aperture for the reflection beam reception, in accordance with the level difference defining the alignment mark of the wafer; and detecting the alignment mark of the wafer with the changed numerical aperture.

29. A method according to claim 28, further comprising detecting the alignment mark of the wafer using a detection optical system having a sigma value and wherein, when the level difference (h) is in a range of $0 < h \leqq 0.05$ (micron), the sigma value ($\sigma$) is set in a range of $0 < \sigma \leqq 0.4$.

30. A method of manufacturing semiconductor devices, wherein an image of an alignment mark of a wafer defined by a level difference is detected by projecting a radiation beam to the wafer and by receiving a reflection beam reflected from the wafer, wherein a position of the wafer is then adjusted on the basis of the detection of the image of the alignment mark of the wafer, and wherein the wafer is then exposed with radiation energy to thereby print a circuit pattern on the wafer, said method comprising the steps of:

changing at least one of a numerical aperture for the radiation beam projection and a numerical aperture for the reflection beam reception, so as to provide higher contrast of the image of the alignment mark of the wafer; and detecting the alignment mark of the wafer with the changed numerical aperture.

31. A method according to claim 30, further comprising detecting the alignment mark of the wafer using a detection optical system having a sigma value and wherein, when the level difference (h) is in a range of $0 < h \leqq 0.05$ (micron), the sigma value ($\sigma$) is set in a range of $0 < \sigma \leqq 0.4$.

32. A method of manufacturing semiconductor devices, wherein an image of an alignment mark of a wafer defined by a level difference is detected by projecting a radiation beam to the wafer and by receiving a reflection beam reflected from the wafer, wherein a position of the wafer with respect to a circuit pattern of a mask is then adjusted on the basis of the detection of the image of the alignment mark of the wafer, and wherein the wafer is then exposed to the circuit pattern of the mask with radiation energy to thereby print the circuit pattern on the wafer, said method comprising the steps of:

changing at least one of a numerical aperture for the radiation beam projection and a numerical aperture for the reflection beam reception, in accordance with the level difference defining the alignment mark of the wafer; and detecting the alignment mark of the wafer with the changed numerical aperture.

33. A method according to claim 32, further comprising detecting the alignment of the wafer using a detection optical system having a sigma value and wherein, when the level difference (h) is in a range of $0 < h \leqq 0.05$ (micron), the sigma value ($\sigma$) is set in a range of $0 < \sigma \leqq 0.4$.

* * * * *

UNITED STATES PATENT AND TRADEMARK OFFICE
CERTIFICATE OF CORRECTION

PATENT NO. : 5,172,189

DATED : December 15, 1992

INVENTOR(S) : Noriyuki Mitome

It is certified that error appears in the above-identified patent and that said Letters Patent is hereby corrected as shown below:

COLUMN 2

Line 27, "of" should be deleted.

COLUMN 4

Line 36, "factor" should read --factor $\sigma$--.

COLUMN 5

Line 67, "described.," should read --described,--.

COLUMN 6

Line 65, "system 101" should read --system 101,--.

UNITED STATES PATENT AND TRADEMARK OFFICE
CERTIFICATE OF CORRECTION

PATENT NO. : 5,172,189

DATED : December 15, 1992

INVENTOR(S) : Noriyuki Mitome

It is certified that error appears in the above-identified patent and that said Letters Patent is hereby corrected as shown below:

COLUMN 7

Line 12, "of" should be deleted.

COLUMN 10

Line 21, "factor o" should read --factor $\sigma$--; and
Line 46, "a" should be deleted.

Signed and Sealed this

Eleventh Day of January, 1994

Attest:

BRUCE LEHMAN

Attesting Officer

Commissioner of Patents and Trademarks